United States Patent
Park

(10) Patent No.: US 9,287,806 B2
(45) Date of Patent: Mar. 15, 2016

(54) ELECTROSTATIC CHUCK

(71) Applicant: SAMSUNG DISPLAY CO., LTD., Yongin, Gyeonggi-do (KR)

(72) Inventor: Seong-Su Park, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 341 days.

(21) Appl. No.: 13/781,502

(22) Filed: Feb. 28, 2013

(65) Prior Publication Data

US 2014/0104743 A1    Apr. 17, 2014

(30) Foreign Application Priority Data

Oct. 16, 2012   (KR) .......................... 10-2012-0115026

(51) Int. Cl.
*H02N 13/00* (2006.01)
*H01L 51/56* (2006.01)
*H01L 21/683* (2006.01)

(52) U.S. Cl.
CPC ............ *H02N 13/00* (2013.01); *H01L 21/6833* (2013.01); *H01L 51/56* (2013.01)

(58) Field of Classification Search
CPC ..... H02N 13/00; H01L 21/6833; H01L 51/56
See application file for complete search history.

(56) References Cited

U.S. PATENT DOCUMENTS

| | | |
|---|---|---|
| 2004/0008582 A1* | 1/2004 | Richards et al. ................. 368/10 |
| 2007/0223173 A1* | 9/2007 | Fujisawa et al. ............... 361/234 |
| 2009/0316120 A1* | 12/2009 | Shiraishi et al. ................. 355/30 |
| 2012/0183683 A1* | 7/2012 | Mitsumori et al. ............ 427/162 |
| 2013/0003249 A1* | 1/2013 | Lee ............................... 361/234 |

FOREIGN PATENT DOCUMENTS

| | | |
|---|---|---|
| JP | 10-223742 | 8/1998 |
| JP | 2004-031502 | 1/2004 |
| KR | 1020070091437 A | 9/2007 |
| KR | 1020070091438 A | 9/2007 |

* cited by examiner

*Primary Examiner* — Zeev V Kitov
(74) *Attorney, Agent, or Firm* — Knobbe Martens Olson & Bear LLP

(57) ABSTRACT

Provided is an electrostatic chuck capable of minimizing short circuits of electrodes due to scratches generated on a surface of the electrostatic chuck, and achieving stable absorption.

18 Claims, 6 Drawing Sheets

ELECTROSTATIC CHUCK

CROSS-REFERENCE TO RELATED APPLICATIONS

This application claims the priority benefit of Korean Patent Application No. 10-2012-0115026, filed on Oct. 16, 2012, in the Korean Intellectual Property Office, the disclosure of which is incorporated herein in its entirety by reference.

BACKGROUND

1. Field

The following description relates to an electrostatic chuck, and more particularly, to an electrostatic chuck capable of stably generating an electrostatic force when a part of an electrode has a defect.

2. Description of the Related Technology

An electrostatic chuck fixes and supports a target object by using an electrostatic force, and is used to transfer, absorb, or fix a substrate in a process of manufacturing a semiconductor, a panel, etc. According to the type of target object, electrostatic chucks may be divided into an electrostatic chuck for absorbing a metal sheet, and an electrostatic chuck for absorbing a glass substrate that is an insulator.

In the electrostatic chuck for absorbing a glass substrate, in order to absorb a target object, i.e., a glass substrate that is an insulator, a fine electrode pattern having a small electrode width in comparison to the electrostatic chuck for absorbing a metal sheet is used.

SUMMARY

The present embodiments provide an electrostatic chuck capable of minimizing damage of electrodes due to scratches generated on a surface of the electrostatic chuck, and achieving stable absorption.

According to an aspect of the present embodiments, there is provided an electrostatic chuck including an absorption plate for absorbing and supporting a target object; and an absorption electrode formed in the absorption plate and for generating an electrostatic force between the target object and the absorption electrode, wherein the absorption electrode includes a first electrode pattern; and a second electrode pattern formed around the first electrode pattern and having an electrode width greater than the electrode width of the first electrode pattern.

The electrode width of the first electrode pattern may be about 0.5 to about 1 mm, and the electrode width of the second electrode pattern may be about 30 to about 50 mm.

An electrode gap of the first electrode pattern may be about 0.5 to about 1 mm.

An area of the second electrode pattern may be about 15 to about 25% of a whole area of the absorption electrode.

The first electrode pattern may be a pattern in which positive electrodes and negative electrodes are alternately aligned.

The first electrode pattern may include a positive base electrode connected to the positive electrodes; and a negative base electrode connected to the negative electrodes, and each of the positive base electrode and the negative base electrode may be formed in a plural number.

The second electrode pattern may be a pattern in which positive electrodes and negative electrodes are alternately aligned.

The second electrode pattern may include a positive base electrode connected to the positive electrodes; and a negative base electrode connected to the negative electrodes, and each of the positive base electrode and the negative base electrode may be formed in a plural number.

The target object may be a glass substrate.

According to an embodiment, by forming an electrode pattern having a relatively large electrode width in a peripheral region in comparison to a central region, an electrostatic chuck capable of minimizing short circuits of electrodes due to scratches, and achieving stable absorption by using a fine electrode pattern formed in the central region is provided.

BRIEF DESCRIPTION OF THE DRAWINGS

The above and other features and advantages of the present embodiments will become more apparent by describing in detail example embodiments thereof with reference to the attached drawings in which.

DETAILED DESCRIPTION

Figure 1:
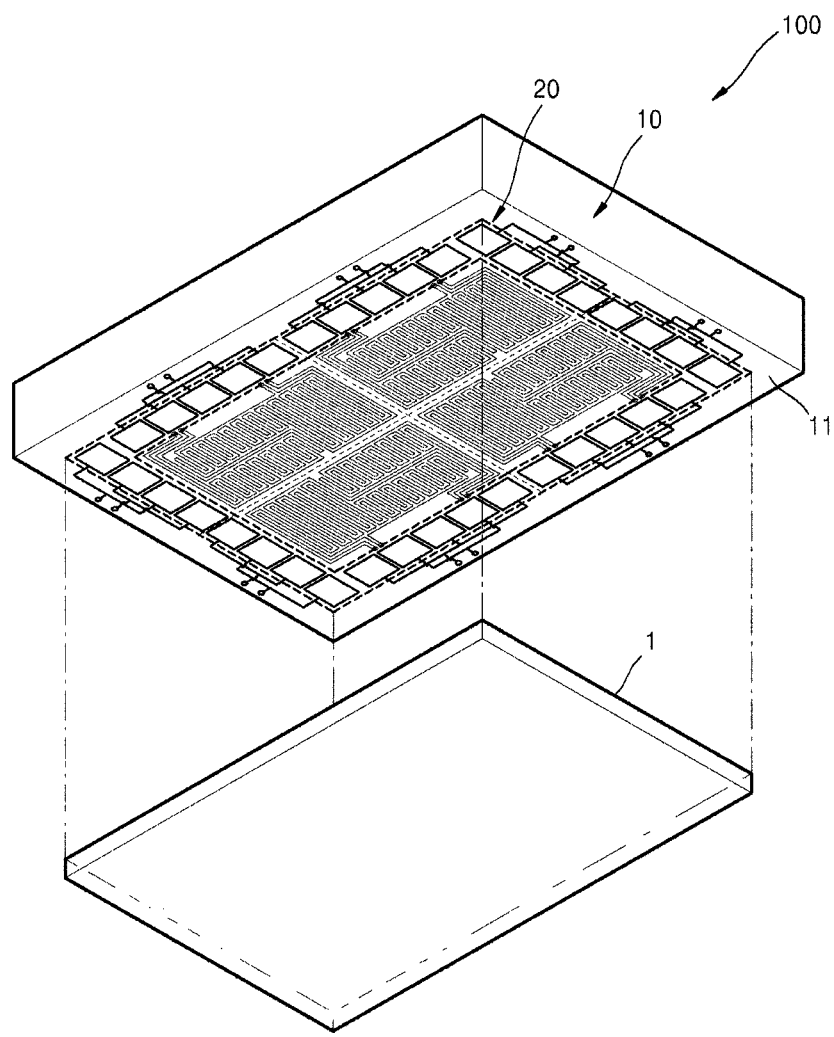
FIG. 1 is a perspective view of an electrostatic chuck according to an embodiment.

Hereinafter, the present embodiments will be described in detail by explaining example embodiments with reference to the attached drawings. The embodiments may, however, be embodied in many different forms, and should not be construed as being limited to the embodiments set forth herein; rather, these embodiments are provided so that this disclosure will be thorough and complete, and will fully convey the concept of the embodiments to those skilled in the art In the following description, well-known functions or constructions are not described in detail since they would obscure the embodiments with unnecessary detail. Also, like reference numerals in the drawings denote like or similar elements throughout the specification.

In the drawings, the thickness of each element or configuration is exaggerated for clarity.

FIG. 1 is a perspective view of an electrostatic chuck 100 according to an embodiment.

Referring to FIG. 1, the electrostatic chuck 100 according to the current embodiment includes an absorption plate 10 for absorbing and supporting a target object 1, and an absorption electrode 20 formed in the absorption plate 10.

When the target object 1 is spaced apart from the absorption plate 10 formed on the target object 1 as illustrated in FIG. 1, if a high voltage is applied to the absorption electrode 20, a potential difference is generated between the absorption electrode 20 and the target object 1. The potential difference generates an electrostatic force between the target object 1 and the absorption electrode 20 such that the target object 1 is absorbed onto an absorption surface 11 of the absorption plate 10. In this case, since the absorption electrode 20 is formed in the absorption plate 10, the absorption electrode 20 may not directly contact and may be spaced apart from the target object 1.

If the applying of a high voltage to the absorption electrode 20 is stopped, the electrostatic force generated between the target object 1 and the absorption electrode 20 disappears and thus the target object 1 is desorbed from the absorption plate 10.

As described above, if an electrostatic force generated by the absorption electrode 20 is used to absorb the target object 1, a reduction in quality of the target object 1, which may be caused when the target object 1 is transferred by using a mechanical chuck, for example, a vacuum chuck, may be prevented.

Figure 2:
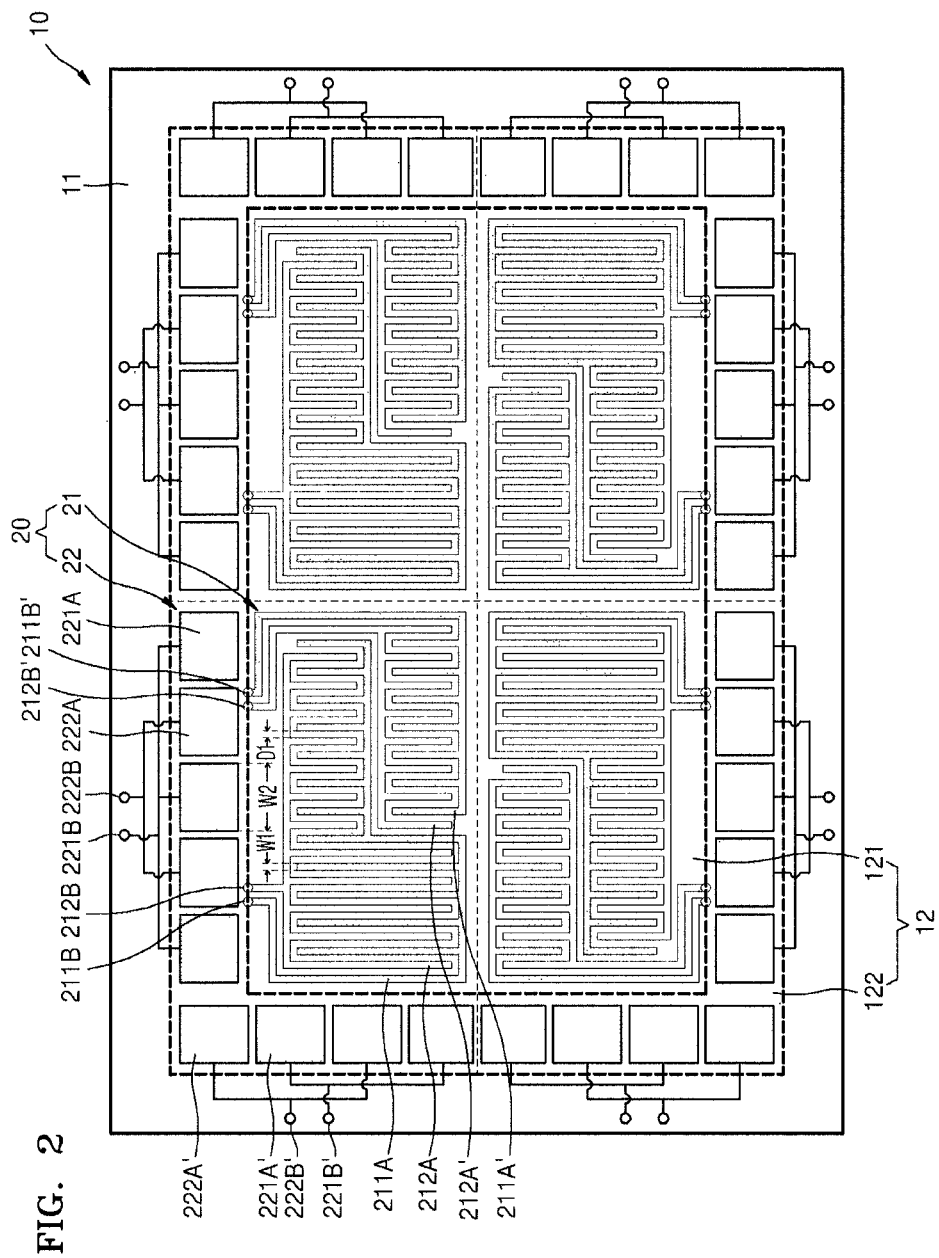
FIG. 2 is a plan view of the electrostatic chuck illustrated in FIG. 1, according to an embodiment.
Figure 3:
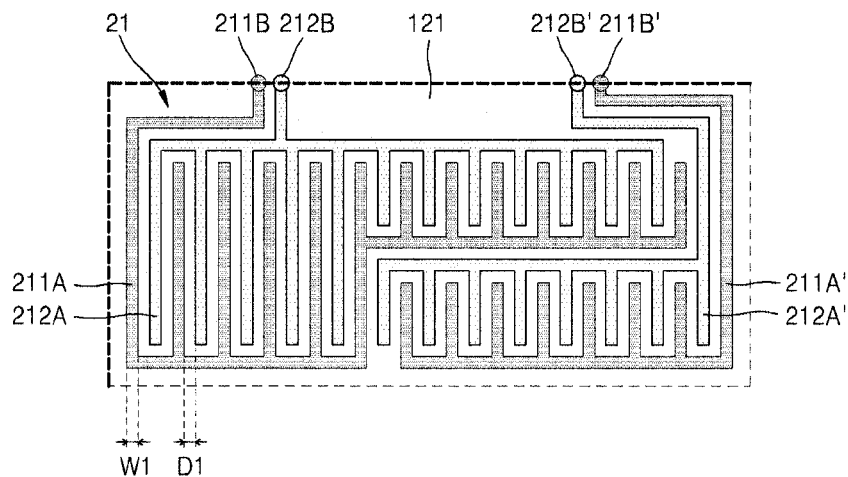
FIG. 3 is a magnified view of one of first electrode patterns of an absorption electrode illustrated in FIG. 2.

FIG. 2 is a plan view of the electrostatic chuck 100 illustrated in FIG. 1, according to an embodiment. FIG. 3 is a magnified view of one of first electrode patterns 21 of the absorption electrode 20 illustrated in FIG. 2.

Referring to FIG. 2, the absorption electrode 20 that generates an electrostatic force may include the first electrode patterns 21 having an electrode width W1, and second electrode patterns 22 having an electrode width W2 greater than the electrode width W1 of the first electrode pattern 21. The absorption plate 10 includes an electrode region 12 in which electrodes are patterned, and the electrode region 12 may be divided into a central region 121 and a peripheral region 122. The first electrode patterns 21 may be formed in the central region 121, and the second electrode patterns 22 may be formed in the peripheral region 122. Although the central region 121 and the peripheral region 122 are divided into four individual regions, and the first electrode pattern 21 and the second electrode pattern 22 are formed in each of the individual regions in FIGS. 1 and 2, the number of the first electrode patterns 21 and the second electrode patterns 22 is not limited thereto. Here, the electrode width W1 or W2 refers to a length of an electrode in a direction perpendicular to a direction in which a current flows in the electrode.

Referring to FIG. 3, the electrode width W1 of the first electrode pattern 21 may be small. For example, the electrode width W1 of the first electrode pattern 21 may be about 0.5 to about 1 mm. Also, the first electrode pattern 21 may have an electrode gap (or distance) D1 of about 0.5 to about 1 mm.

As described above, by allowing the electrode width W1 of the first electrode pattern 21 to be less than the electrode width W2 of the second electrode pattern 22, and allowing the electrode distance D1 of the first electrode pattern 21 to be small, a stable electrostatic force for absorbing the target object 1 may be generated. As such, stable absorption may be achieved even when the target object 1 is an insulator, for example, a glass substrate.

The first electrode pattern 21 may be a pattern in which a plurality of positive electrodes 211A and a plurality of negative electrodes 212A are alternately aligned. The alternately aligned positive electrodes 211A and the negative electrodes 212A may be respectively connected to a first positive base electrode 211B and a first negative base electrode 212B. The positive electrodes 211A may receive a positive voltage via the first positive base electrode 211B from an external device, and the negative electrodes 212A may receive a negative voltage via the first negative base electrode 212B from the external device.

The first electrode pattern 21 may include a plurality of positive base electrodes and a plurality of negative base electrodes. For example, the first electrode pattern 21 may include the first positive base electrode 211B, a second positive base electrode 211B', the first negative base electrode 212B, and a second negative base electrode 212B'. As such, even when scratches are generated on the first positive base electrode 211B or the first negative base electrode 212B, or the positive electrodes 211A or the negative electrodes 212A connected thereto and thus a short circuit occurs, an electrostatic force may be generated by the second positive base electrode 211B' and the second negative base electrode 212B', or a plurality of positive electrodes 211A' and a plurality of negative electrodes 212A' connected thereto and thus the target object 1 may still be effectively absorbed.

Figure 4:
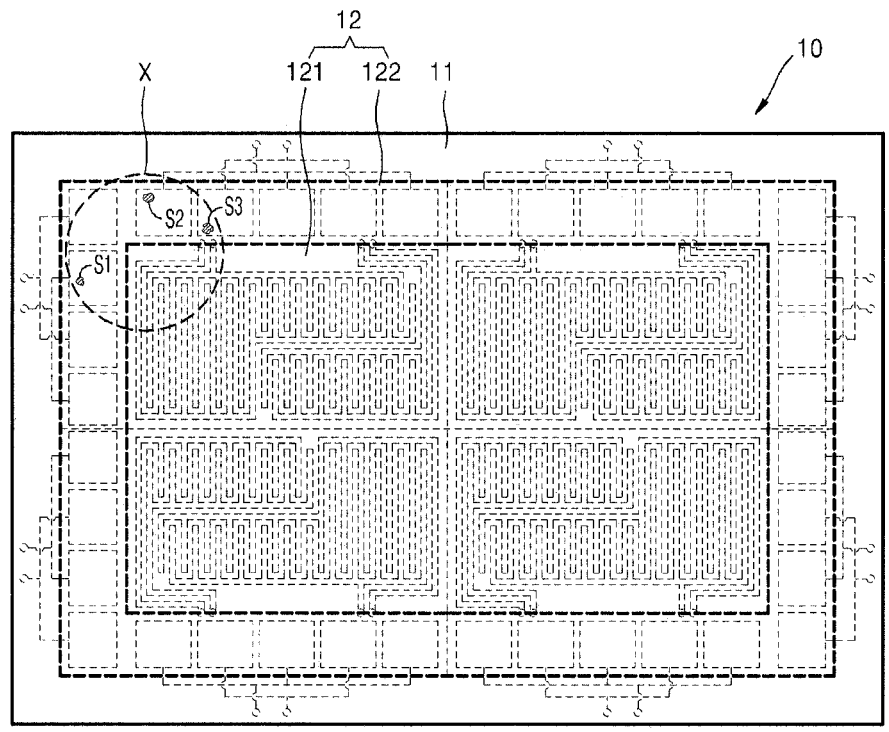
FIG. 4 is a plan view showing an example when scratches are generated on an absorption surface of an absorption plate of the electrostatic chuck illustrated in FIGS. 1 and 2.

FIG. 4 is a plan view showing an example when scratches S1, S2, and S3 are generated on the absorption surface 11 of the absorption plate 10 of the electrostatic chuck 100 illustrated in FIGS. 1 and 2. In the electrostatic chuck 100, due to a foreign substance (particles) generated while the target object 1 is being processed, transferred, or absorbed, as illustrated in FIG. 4, the scratches S1, S2, and S3 may be generated on the absorption surface 11 of the absorption plate 10. As illustrated in FIG. 4, the scratches S1, S2, and S3 are mostly generated in the peripheral region 122 of the electrode region 12 where the first electrode patterns 21 and the second electrode patterns 22 are formed.

Figure 5:
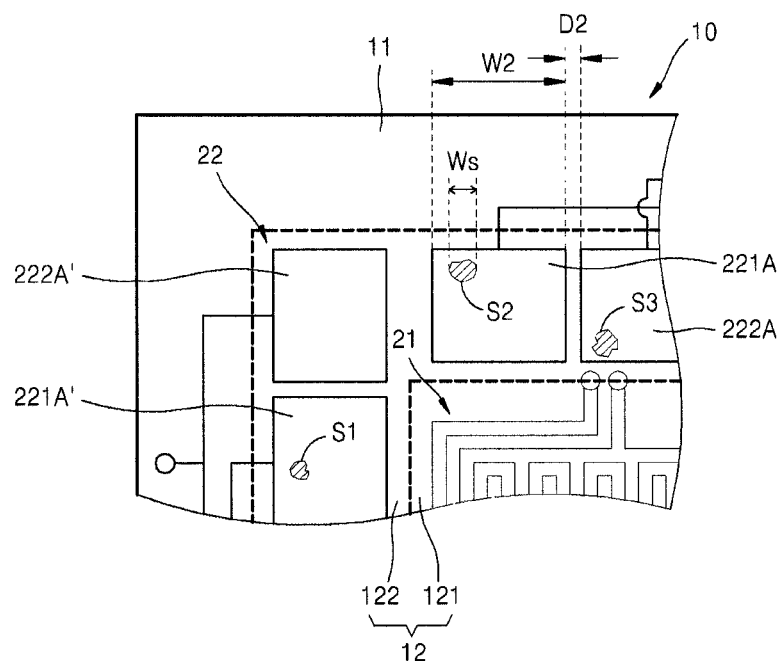
FIG. 5 is a magnified view of region X of a peripheral region illustrated in FIG. 4.

FIG. 5 is a magnified view of region X of the peripheral region illustrated in FIG. 4. Referring to FIG. 5, the second electrode pattern 22 is formed in the peripheral region 122 of the absorption plate 10, and the electrode width W2 of the second electrode pattern 22 is greater than the electrode width W1 of the first electrode pattern 21. For example, the electrode width W2 of the second electrode pattern 22 may be about 30 to about 50 mm.

As described above, by forming the second electrode pattern 22, of which the electrode width W2 is large, in the peripheral region 122 where the scratches S1, S2, and S3 are frequently generated, a short circuit that can be caused due to the scratches S1, S2, and S3 may be prevented. In more detail, although the scratches S1, S2, and S3 are generated in the peripheral region 122 due to a foreign substance, since the electrode width W2 of the second electrode pattern 22 is greater than a width Ws of the scratches S1, S2, and S3, a short circuit of electrodes 221A, 222A, 221A', and 222A' due to the scratches S1, S2, and S3 does not occur. As described above, since a short circuit of the electrodes 221A, 222A, 221A', and 222A' due to the scratches S1, S2, and S3 is prevented, a reduction in absorption force due to a short circuit may be prevented and thus separation of the target object 1 while it is being transferred may also be prevented. Furthermore, costs and time for replacing the electrostatic chuck 100 itself or a plate of an individual region of the electrostatic chuck 100 due to a short circuit may be minimized.

Also, the second electrode pattern 22 may have an electrode distance D2 greater than the electrode distance D1 of the first electrode pattern 21.

Referring back to FIG. 2, the second electrode pattern 22 may be a pattern in which a plurality of positive electrodes 221A and a plurality of negative electrodes 222A are alternately aligned. The alternately aligned positive electrodes 221A and the negative electrodes 222A may be respectively connected to a first positive base electrode 221B and a first negative base electrode 222B. The positive electrodes 221A may receive a positive voltage via the first positive base electrode 221B from an external device, and the negative electrodes 222A may receive a negative voltage via the first negative base electrode 222B from the external device.

The second electrode pattern 22 may include a plurality of positive base electrodes and a plurality of negative base electrodes. For example, the second electrode pattern 22 may include the first positive base electrode 221B, a second positive base electrode 221B', the first negative base electrode 222B, and a second negative base electrode 222B'. Even when scratches are generated on the first positive base electrode 221B or the first negative base electrode 222B, or the positive electrodes 221A or the negative electrodes 222A connected thereto and thus a short circuit occurs, an electrostatic force may be generated by the second positive base electrode 221B' and the second negative base electrode 222B', or a plurality of positive electrodes 221A' and a plurality of negative electrodes 222A' connected thereto and thus the target object 1 may still be effectively absorbed.

The second electrode pattern 22 may be formed to be separated from or to be connected to the first electrode pattern 21. For example, as illustrated in FIG. 2, the base electrodes 221B, 222B, 221B', and 222B' of the second electrode patterns 22 and the base electrodes 211B, 212B, 211B', and 212B' of the first electrode patterns 21 may be separately formed and may be connected to different power sources. As another example, although not illustrated in FIG. 2, the base electrodes 221B, 222B, 221B', and 222B' of the second electrode patterns 22 may be connected to the base electrodes 211B, 212B, 211B', and 212B' of the first electrode patterns 21. However, the connection of the second electrode patterns 22 is not limited thereto and the electrodes 221A, 222A, 221A', and 222A' of the second electrode patterns 22 may be connected to the base electrodes 211B, 212B, 211B', and 212B' of the first electrode patterns 21 if necessary.

Figure 6:
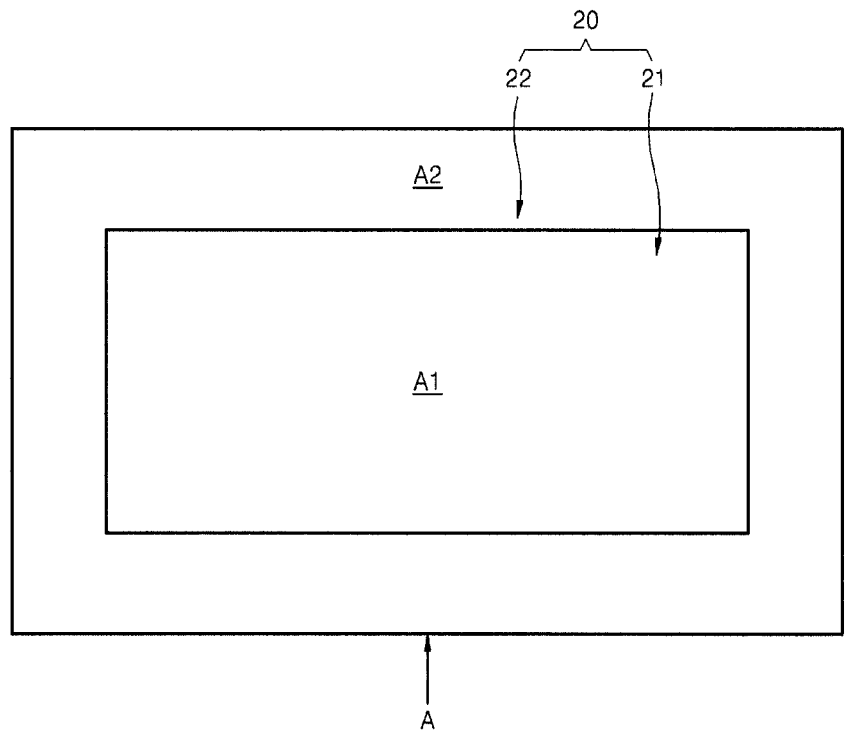
FIG. 6 is a plan view showing an area of second electrode patterns with respect to a whole area of the absorption electrode illustrated in FIGS. 1 and 2, according to an embodiment.

FIG. 6 is a plan view showing an area A2 of the second electrode patterns 22 with respect to a whole area A of the absorption electrode 20 illustrated in FIGS. 1 and 2, according to an embodiment. Detailed electrode shapes of the first electrode patterns 21 and the second electrode patterns 22 are the same as those illustrated in FIG. 2 and thus are not illustrated in FIG. 6 for convenience of explanation.

The area A2 of the second electrode patterns 22 may be determined in consideration of an absorption force on the target object 1 and a short circuit due to scratches. Here, an area A, A1, or A2 includes an area of electrodes themselves and an area of spaces between the electrodes, and refers to an area occupied by the electrodes. The whole area A is a sum of an area A1 of the first electrode patterns 21 and the area A2 of the second electrode patterns 22.

The area A2 of the second electrode patterns 22 may be about 15 to about 25% of the whole area A of the absorption electrode 20. As such, a short circuit due to scratches generated on the absorption electrode 20 may be prevented, and a stable absorption force capable of preventing the target object 1 from being dropped may be provided. If the area A2 of the second electrode patterns 22 is less than 15% of the whole area A of the absorption electrode 20, the scratches S1, S2, and S3 may be generated on the first electrode patterns 21 to cause a short circuit and thus a uniform absorption force may not be provided to the target object 1. Otherwise, if the area A2 of the second electrode patterns 22 is greater than 25% of the whole area A of the absorption electrode 20, since the area A1 of the first electrode patterns 21 is reduced, an absorption force on the target object 1 may be reduced and thus the target object 1 may be dropped while it is being transferred.

Figure 7:
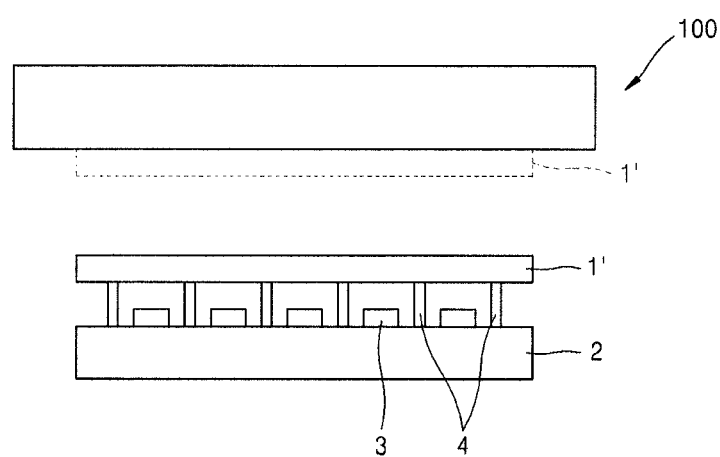
FIG. 7 is a structural view showing that the electrostatic chuck 100 illustrated in FIG. 1 is used, according to an embodiment.

FIG. 7 is a structural view showing that the electrostatic chuck 100 illustrated in FIG. 1 is used, according to an embodiment. Referring to FIG. 7, the electrostatic chuck 100 according to the current embodiment may be used to manufacture an organic light-emitting display apparatus.

The organic light-emitting display apparatus may include a substrate 2, an organic light-emitting unit 3 formed on a surface of the substrate 2, an encapsulation substrate 1' formed on the organic light-emitting unit 3, and a bonding member 4 for bonding the substrate 2 and the encapsulation substrate 1'.

The electrostatic chuck 100 absorbs an upper surface of the encapsulation substrate 1'. The electrostatic chuck 100 moves while the encapsulation substrate 1' is being absorbed, and aligns the encapsulation substrate 1' on the substrate 2 on which the organic light-emitting unit 3 is formed.

Due to a foreign substance generated while the encapsulation substrate 1' is being processed or transferred, or an impression generated while the encapsulation substrate 1' is being absorbed, the scratches S1, S2, and S3 may be generated in the peripheral region 122 (see FIG. 4) of the electrostatic chuck 100. In the current embodiment, even when the scratches S1, S2, and S3 are generated in the peripheral region 122, since the second electrode patterns 22 having the electrode width W2 greater than the electrode width W1 of the first electrode pattern 21 are formed in the peripheral region 122, a short circuit does not occur. As described above, by preventing a short circuit of electrodes due to the scratches S1, S2, and S3, a reduction in absorption force due to a short circuit may be prevented and thus dropping of the target object 1 while it is being transferred may also be prevented. Furthermore, costs and time for replacing the electrostatic chuck 100 itself or a plate of an individual region of the electrostatic chuck 100 due to a short circuit may be minimized.

Figure 8:
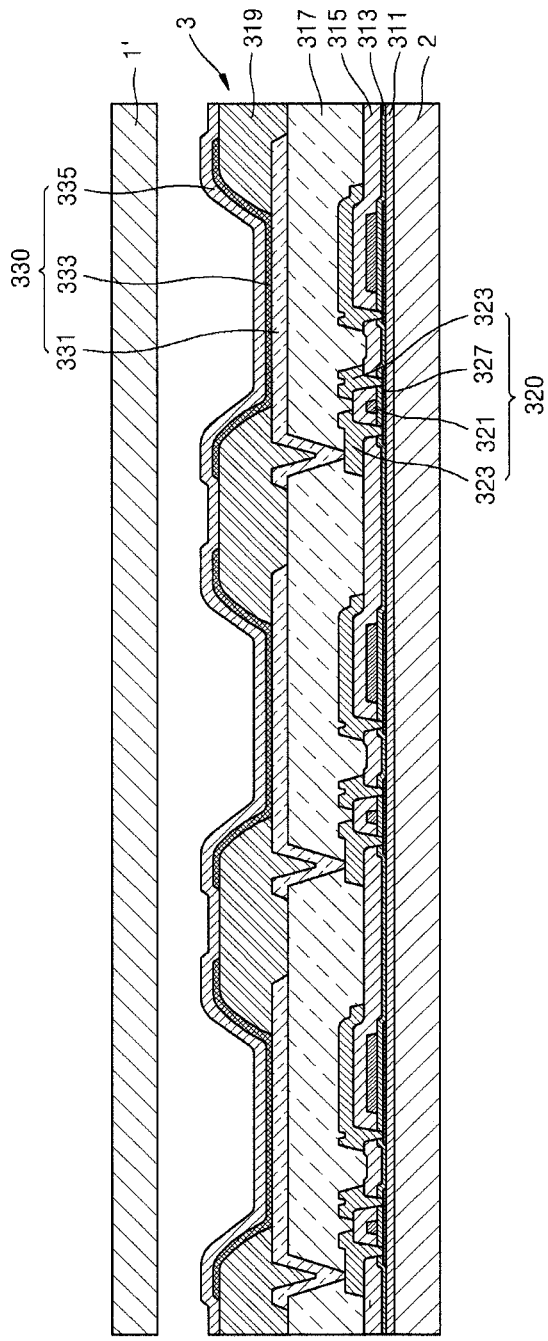
FIG. 8 is a cross-sectional view of a part of an organic light-emitting display apparatus illustrated in FIG. 7.

FIG. 8 is a cross-sectional view of a part of the organic light-emitting display apparatus illustrated in FIG. 7, and shows the configuration of the organic light-emitting unit 3.

Referring to FIG. 8, a plurality of thin film transistors 320 are formed on the substrate 2, and an organic light-emitting device 330 formed on each of the thin film transistors 320. The organic light-emitting device 330 includes a pixel electrode 331 electrically connected to the thin film transistor 320, a counter electrode 335 formed over a whole surface of the substrate 2, and an intermediate layer 333 formed between the pixel electrode 331 and the counter electrode 335 and including at least an emission layer.

The thin film transistor 320 formed on the substrate 2 includes a gate electrode 321, source and drain electrodes 323, a semiconductor layer 327, a gate insulating layer 313, and an interlayer insulating layer 315. The form of the thin film transistors 320 is not limited thereto, and various thin film transistors such as an organic thin film transistor in which the semiconductor layer 327 is formed of an organic material, and a silicon thin film transistor in which the semiconductor layer 327 is formed of silicon may be used. A buffer layer 311 formed of silicon oxide or silicon nitride may be further formed between the thin film transistor 320 and the substrate 2 if necessary.

The organic light-emitting device 330 includes the pixel electrode 331 and the counter electrode 335 facing each other, and the intermediate layer 333 formed therebetween by using an organic material. The intermediate layer 333 includes at least an emission layer, and may include a plurality of layers which will be described below.

The pixel electrode 331 functions as an anode, and the counter electrode 335 functions as a cathode. The polarities of the pixel electrode 331 and the counter electrode 335 may be switched.

The pixel electrode 331 may be formed as a transparent electrode or a reflective electrode. As a transparent electrode, the pixel electrode 331 may be formed of indium tin oxide (ITO), indium zinc oxide (IZO), zinc oxide (ZnO), or indium oxide ($In_2O_3$). As a reflective electrode, the pixel electrode 331 may include a reflective layer formed of silver (Ag), magnesium (Mg), aluminum (Al), platinum (Pt), palladium (Pd), gold (Au), nickel (Ni), neodymium (Nd), iridium (Ir), chromium (Cr), or a compound thereof, and a layer formed of ITO, IZO, ZnO, or $In_2O_3$ thereon.

The counter electrode 335 may also be formed as a transparent electrode or a reflective electrode. As a transparent electrode, the counter electrode 335 may include a layer formed by depositing lithium (Li), calcium (Ca), LiF/Ca, LiF/Al, Al, Mg, or a compound thereof toward the intermediate layer 333 between the pixel electrode 331 and the counter electrode 335, and an auxiliary electrode or a bus electrode line formed of a transparent electrode forming material such as ITO, IZO, ZnO, or $In_2O_3$ thereon. As a reflective electrode, the counter electrode 335 may formed by depositing Li, Ca, LiF/Ca, LiF/Al, Al, Mg, or a compound thereof.

A pixel defining layer 319 is formed around the pixel electrode 331 to cover edges of the pixel electrode 331 and to have a thickness. The pixel defining layer 319 defines a light-emitting region and increases a distance between the edges of the pixel electrode 331 and the counter electrode 335 to prevent an electric field from being focused on the edges of the pixel electrode 331, and thus to prevent a short circuit of the pixel electrode 331 and the counter electrode 335.

The intermediate layer 333 between the pixel electrode 331 and the counter electrode 335 includes various layers including at least an emission layer. The intermediate layer 333 may be formed of a low-molecular weight organic material or a high-molecular weight organic material.

If a low-molecular weight organic material is used, the intermediate layer 333 may have a structure including one or more of a hole injection layer (HIL), a hole transport layer (HTL), an emission layer (EML), an electron transport layer (ETL), and an electron injection layer (EIL), and may be formed of various organic materials such as copper phthalocyanine (CuPc), N,N'-Di(naphthalene-1-yl)-N,N'-diphenyl-benzidine (NPB), and tris-8-hydroxyquinoline aluminum ($Alq_3$). The low-molecular weight organic materials may be vacuum deposited by using masks.

If the high-molecular weight organic layer is used, the intermediate layer 333 may have a structure including only the HTL and the EML. In this case, the HTL may be formed of poly-(2,4)-ethylene-dihydroxy thiophene (PEDOT), and the EML may be formed of a polyphenylene vinylene (PPV)-based and polyfluorene-based high-molecular weight organic material.

The organic light-emitting device 330 is electrically connected to the thin film transistor 320 formed thereunder. In this case, if a planarization layer 317 is formed to cover the thin film transistor 320, the organic light-emitting device 330 is formed on the planarization layer 317, and the pixel electrode 331 of the organic light-emitting device 330 is electrically connected to the thin film transistors 320 through a contact hole formed in the planarization layer 317.

The organic light-emitting device 330 formed on the substrate 2 is sealed by the encapsulation substrate 1'.

The above-described electrostatic chuck 100 may be used in, for example, a vacuum processing apparatus. However, an application field of the electrostatic chuck 100 is not limited to a vacuum processing apparatus and may be variously changed. Also, although the electrostatic chuck 100 is located on the target object 1 and absorbs the target object 1 in an upward direction in the drawings, the location of the electrostatic chuck 100 is not limited thereto and the electrostatic chuck 100 may be located under the target object 1 and may absorb the target object 1 in a downward direction.

While the present embodiments have been particularly shown and described with reference to example embodiments thereof, it will be understood by those of ordinary skill in the art that various changes in form and details may be made therein without departing from the spirit and scope of the present embodiments as defined by the following claims.

What is claimed is:

1. An electrostatic chuck comprising:
   an absorption plate configured to absorb and support a target object; and
   a rectangular absorption electrode formed in the absorption plate configured to generate an electrostatic force between the target object and the absorption electrode,
   wherein the absorption electrode comprises:
   a first electrode pattern; and
   a second electrode pattern formed around the first electrode pattern, having an electrode width greater than the electrode width of the first electrode pattern, and having an area less than or equal to the area of the first electrode pattern;
   wherein the electrode width of the first electrode pattern is about 0.5 to about 1 mm.

2. The electrostatic chuck of claim 1, wherein the electrode width of the second electrode pattern is about 30 to about 50 mm.

3. The electrostatic chuck of claim 1, wherein an electrode gap of the first electrode pattern is about 0.5 to about 1 mm.

4. The electrostatic chuck of claim 2, wherein an area of the second electrode pattern is about 15 to about 25% of a whole area of the absorption electrode.

5. The electrostatic chuck of claim 1, wherein the first electrode pattern comprises alternately aligned positive electrodes and negative electrodes.

6. The electrostatic chuck of claim 5, wherein the first electrode pattern comprises:
   a plurality of positive base electrodes connected to the positive electrodes; and
   a plurality of negative base electrodes connected to the negative electrodes.

7. The electrostatic chuck of claim 1, wherein the second electrode pattern comprises alternately aligned electrodes and negative electrodes.

8. The electrostatic chuck of claim 7, wherein the second electrode pattern comprises:
   a plurality of positive base electrodes connected to the positive electrodes; and
   a plurality of negative base electrodes connected to the negative electrodes.

9. The electrostatic chuck of claim 1, wherein the target object is a glass substrate.

10. A method of manufacturing an organic light-emitting display apparatus using the electrostatic chuck of claim 1 comprising:
    generating an electrostatic force between a target object of the organic light-emitting display apparatus and the absorption electrode; and
    absorbing and supporting the target object on the absorption plate.

11. The method of claim 10, wherein the electrode width of the second electrode pattern is about 30 to about 50 mm.

12. The method of claim 10, wherein an electrode gap of the first electrode pattern is about 0.5 to about 1 mm.

13. The method of claim 11, wherein an area of the second electrode pattern is about 15 to about 25% of a whole area of the absorption electrode.

14. The method of claim 10, wherein the first electrode pattern comprises alternately aligned positive electrodes and negative electrodes.

15. The method of claim 14, wherein the first electrode pattern comprises:
   a plurality of positive base electrodes connected to the positive electrodes; and
   a plurality of negative base electrodes connected to the negative electrodes.

16. The method of claim 10, wherein the second electrode pattern comprises alternately aligned electrodes and negative electrodes.

17. The method of claim 16, wherein the second electrode pattern comprises:
   a plurality of positive base electrodes connected to the positive electrodes; and
   a plurality of negative base electrodes connected to the negative electrodes.

18. The method of claim 10, wherein the target object is a glass substrate.

* * * * *